United States Patent
Saeedfar et al.

(10) Patent No.: US 9,922,145 B2
(45) Date of Patent: Mar. 20, 2018

(54) WIDE FREQUENCY RANGE MODELING OF ELECTROMAGNETIC HEATING FOR HEAVY OIL RECOVERY

(71) Applicant: SCHLUMBERGER TECHNOLOGY CORPORATION, Sugar Land, TX (US)

(72) Inventors: Amin Saeedfar, Edmonton (CA); David Hin-Sum Law, Edmondton (CA)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 444 days.

(21) Appl. No.: 14/422,130

(22) PCT Filed: Aug. 16, 2013

(86) PCT No.: PCT/US2013/055328
§ 371 (c)(1),
(2) Date: Feb. 17, 2015

(87) PCT Pub. No.: WO2014/028834
PCT Pub. Date: Feb. 20, 2014

(65) Prior Publication Data
US 2015/0227649 A1    Aug. 13, 2015

Related U.S. Application Data

(60) Provisional application No. 61/684,283, filed on Aug. 17, 2012.

(51) Int. Cl.
*G06F 7/60* (2006.01)
*G06F 17/10* (2006.01)
(Continued)

(52) U.S. Cl.
CPC ........ *G06F 17/5009* (2013.01); *E21B 47/065* (2013.01); *G01V 99/005* (2013.01); *G06F 17/10* (2013.01)

(58) Field of Classification Search
CPC ... G06F 17/5009; G06F 17/10; G01V 99/005; E21B 47/065
(Continued)

(56) References Cited

U.S. PATENT DOCUMENTS 4,470,459 A     9/1984   Copland et al.
6,088,655 A *   7/2000   Daily ................... G01V 3/24
                                                     702/7
(Continued)

OTHER PUBLICATIONS

Abernethy, "Production Increase of Heavy Oils by Electromagnetic Heating", Journal of Canadian PetroleumTechnology, vol. 15, No. 3, Jul. 1976, 7 pages.
(Continued)

*Primary Examiner* — Dwin M Craig

(57) ABSTRACT

A method of modeling electromagnetic heating for oil recovery for a wide range of frequencies includes arranging a plurality of electrodes and/or antennas in an array in a multi-layer earth model of a reservoir formation, wherein the arranging includes selecting a number of electrodes/antennas and an array topology; selecting a frequency of the array; determining a temperature profile of the reservoir using the frequency and reservoir formation characteristics; providing the a heat rate to a reservoir simulator; inputting reservoir characteristics into the reservoir simulator; calculating, by processor, an oil recovery production rate of the reservoir based on the heat rate and reservoir characteristics; and graphically displaying the oil recovery production rate.

18 Claims, 8 Drawing Sheets

(51) Int. Cl.
*G06F 17/50* (2006.01)
*E21B 47/06* (2012.01)
*G01V 99/00* (2009.01)

(58) Field of Classification Search
USPC .............................................................. 703/2
See application file for complete search history.

(56) References Cited

U.S. PATENT DOCUMENTS

| | | | |
|---|---|---|---|
| 7,115,847 B2 | 10/2006 | Kinzer | |
| 7,753,119 B2 | 7/2010 | Chen et al. | |
| 2003/0103551 A1* | 6/2003 | Haddad | E21B 47/065 374/136 |
| 2009/0008079 A1 | 1/2009 | Zazovsky et al. | |
| 2009/0242196 A1* | 10/2009 | Pao | E21B 43/2401 166/248 |
| 2009/0260823 A1* | 10/2009 | Prince-Wright | C10G 21/22 166/302 |
| 2012/0118565 A1* | 5/2012 | Trautman | E21B 43/16 166/272.6 |
| 2012/0125608 A1 | 5/2012 | Parsche | |

OTHER PUBLICATIONS

Bogdanov, et al., "Comparative Analysis of Electromagnetic Methods for Heavy Oil Recovery", SPE-150550-MS, Society of Petroleum Engineers, SPE Heavy Oil Conference and Exhibition, Kuwait City, Kuwait, Dec. 12-14, 2011, 15 pages.
Carrizales, et al., "Production Improvement of Heavy-Oil Recovery by Using Electromagnetic Heating", SPE-115723-MS, Society of Petroleum Engineers, SPE Annual Technical Conference and Exhibition, Denver, Colorado, USA, Sep. 21-24, 2008, 16 pages.
Fanchi, et al., "Feasibility of Near-Wellbore Heating by Electromagnetic Irradiation", SPE-20483-PA, Society of Petroleum Engineers, SPE Advanced Technology Series, vol. 1, Issue 2, Jul. 1993, 9 pages.
Godard, et al., "Radio Frequency Heating, Oil Sand Recovery Improvement", SPE-150561-MS, Society of Petroleum Engineers, SPE Heavy Oil Conference and Exhibition, Kuwait City, Kuwait, Dec. 12-14, 2011, 8 pages.
Hascakir, et al., "Experimental and Numerical Modeling of Heavy-Oil Recovery by Electrical Heating", SPE-117669-MS, Society of Petroleum Engineers, International Thermal Operations and Heavy Oil Symposium, Calgary, Alberta, Canada, Oct. 20-23, 2008, 14 pages.
Hascakir, et al., "Microwave Assisted Gravity Drainage of Heavy Oils", IPTC International Petroleum Technology Conference—Meeting the Energy Needs of a Growing World Economy, Dec. 3, 2008, 9 pages.
Hill, et al., "Direct Current Electrical Enhanced Oil Recovery in Heavy-Oil Reservoirs to Improve Recovery, Reduce Water Cut, and Reduce H2S Production While Increasing API Gravity", SPE-114012-MS, Society of Petroleum Engineers, SPE Western Regional and Pacific Section AAPG Joint Meeting, Bakersfield, California, USA, Mar. 29-Apr. 4, 2008, 19 pages.
McGee, et al., "In Situ Decontamination of Soil", PETSOC-98-07-01, Petroleum Society of Canada, Journal of Canadian Petroleum Technology, vol. 37, Issue 7, Jul. 1998, 8 pages.
McGee, et al., "The Mechanisms of Electrical Heating for the Recovery of Bitumen From Oil Sands", PETSOC-07-01-03, Petroleum Society of Canada, Journal of Canadian Petroleum Technology, vol. 48, Issue 1, Jan. 2007, 7 pages.
Mutyala, et al., "Microwave applications to oil sands and petroleum: A review", Fuel Processing Technology, vol. 91, Issue 2, Feb. 2010, pp. 127-135.
Sahni, et al., "Electromagnetic Heating Methods for Heavy Oil Reservoir", SPE-62550-MS, Society of Petroleum Engineers, SPE/AAPG Western Regional Meeting, Long Beach, California, Jun. 19-22, 2000, 10 pages.
Valiullin, et al., "Enhancement of Well Productivity Using a Technique of High-Frequency Induction Treatment", SPE-157724-MS, Society of Petroleum Engineers, SPE Heavy Oil Conference Canada, Calgary, Alberta, Canada, Jun. 12-14, 2012, 7 pages.
Vermeulen, et al., "In-Situ Electromagnetic Heating for Hydrocarbon Recovery and Environmental Remediation", PETSOC-00-08-DAS, Petroleum Society of Canada, Journal of Canadian Petroleum Technology, vol. 39, Issue 8, Aug. 2000, 5 pages.
Vinsome, et al., "Electrical Heating", PETSOC-94-04-04, Petroleum Society of Canada, Journal of Canadian Petroleum Technology, vol. 33, Issue 4, Apr. 1994, 8 pages.
Yuan, et al., "Wet Electric Heating for Starting Up SAGD/VAPEX", PETSOC-2004-130, Petroleum Society of Canada, Canadian International Petroleum Conference, Calgary, Alberta, Jun. 8-10, 2004, 12 pages.
International Search Report and Written Opinion for corresponding PCT Application No. PCT/US2013/055328 dated Oct. 24, 2013, 11 pages.

\* cited by examiner

WIDE FREQUENCY RANGE MODELING OF ELECTROMAGNETIC HEATING FOR HEAVY OIL RECOVERY

CROSS-REFERENCE TO RELATED APPLICATIONS

This application claims priority to U.S. Patent Provisional Application Ser. No. 61/684,283, filed on Aug. 17, 2012, entitled "Improvements on Wide Frequency Range Modeling of Electromagnetic Heating for Heavy Oil Recovery," to Saeedfar et al., the disclosure of which is herein incorporated by reference herein in its entirety.

BACKGROUND OF INVENTION

During a recovery process for hydrocarbons, particularly heavy oil, the inherent high viscosity of heavy oil (HO) is an obstacle to reservoir production and subsequent handling on the surface. Thus, heating techniques, for example electromagnetic (EM) heating, may be used to reduce the viscosity of the oil. The oil may then be extracted through the borehole for onsite or offsite refinement.

EM heating is particularly useful as conventional steam injection techniques for heavy oil recovery are sometimes limited to relatively shallow, thick, and permeable reservoirs. EM heating refers to heating produced by the absorption of electromagnetic energy by the molecules in formation. EM heating does not require a heat transporting fluid such as steam, which can be beneficial for deep reservoirs and thin pay-zones. In fact, EM thermal processes are mostly free of issues such as poor heat transfer, shale layers between rich oil layers, cap rock requirement, and the difficulty of controlling the movement of injected fluid and gases, all of which have impacted other thermally stimulated recovery processes.

EM heating can be divided based on the frequency of the electrical current used by the source, direct (DC)/low frequency currents and high frequency (radio frequency, microwave) currents, which may be employed depending on reservoir fluid properties (e.g., resistivity, dielectric permittivity) and other formation characteristics.

Applications of EM heating for heavy oil recovery may benefit from detailed analysis. Previous analytical models use relatively strong assumptions and focus on a single range of frequencies (i.e., high frequency or low frequency). They consider only a single electrode (low frequency) or antenna (high frequency), and calculate the heating rate for a homogenous single layered formation where in the case of low frequency heating, approximation of infinitely long electrode and for the high frequency heating, Lambert's law of absorption as a simplified radial model of EM wave propagation have been adopted.

SUMMARY OF INVENTION

In one aspect, embodiments disclosed herein relate to a method of modeling electromagnetic heating for oil recovery for a wide range of frequencies that includes arranging a plurality of electrodes and/or antennas in an array in a multi-layer earth model of a reservoir formation, wherein the arranging includes selecting a number of electrodes/antennas and an array topology, selecting a frequency of the array; determining a temperature profile of the reservoir using the frequency and reservoir formation characteristics; providing the a heat rate to a reservoir simulator; inputting reservoir characteristics into the reservoir simulator; calculating, by processor, an oil recovery production rate of the reservoir based on the heat rate and reservoir characteristics; and graphically displaying the oil recovery production rate.

In another aspect, embodiments disclosed herein relate to a method of designing an electrode array for oil recovery that includes geometrically arranging a first plurality of electrodes/antennas in a multi-layer earth model; selecting a first frequency for at least one of the first plurality of electrodes/antennas; calculating a heating rate of the first plurality of electrodes electrodes/antennas using the first frequency; inputting the heating rate into a reservoir simulator; calculating, by processor, an oil recovery production rate for the electrode/antenna array; and repeating the selecting, arranging, calculating a heating rate and calculating an oil recovery production rate until a target oil recovery production rate is achieved, wherein at least one of the geometrically arranging and selecting a first frequency is different from a frequency and geometrical arrangement of the first plurality of electrodes/antennas.

In another aspect, embodiments disclosed herein relate to a method of evaluating an electrode array for oil recovery that includes selecting characteristics of an electrode array, wherein the characteristics comprise at least one selected from frequency and geometry; geometrically arranging electrodes/antennas in a first reservoir formation; calculating a heating rate of the electrode/antenna array using EM dissipated energy equation; inputting the heating rate into a reservoir simulator; calculating, by processor, an oil recovery production rate for the electrode array; and repeating the geometrically arranging, calculating a heating rate and calculating an oil recovery production rate for at least a second reservoir formation.

This summary is provided to introduce a selection of concepts that are further described below in the detailed description. This summary is not intended to identify essential features of the claimed subject matter, nor is it intended to be used as an aid in limiting the scope of the claimed subject matter. Other aspects and advantages of the invention will be apparent from the following description and the appended claims.

DETAILED DESCRIPTION

Figure 1:
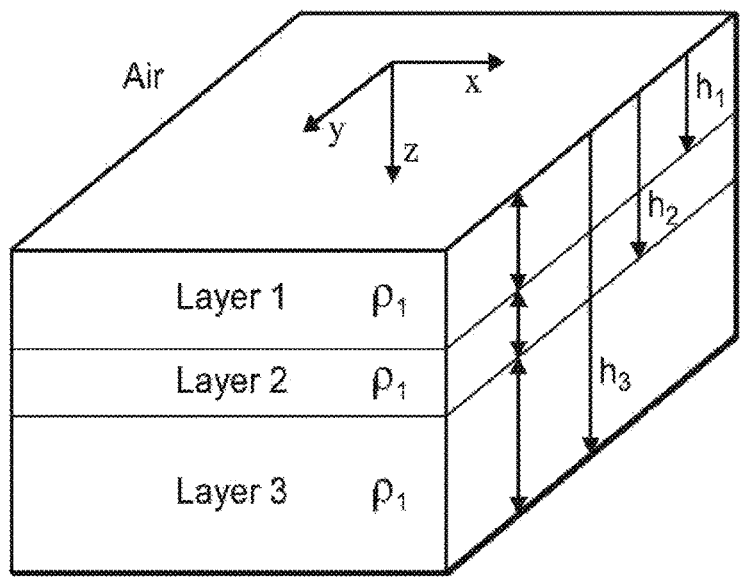
FIG. 1 illustrates of a three-layer earth model in accordance with one or more embodiments disclosed herein.

In the following detailed description of embodiments, numerous specific details are set forth in order to provide a more thorough understanding. However, it will be apparent to one of ordinary skill in the art that the disclosed subject matter of the application may be practiced without these specific details. In other instances, well-known features have not been described in detail to avoid unnecessarily complicating the description.

In heavy oil recovery, electromagnetic (EM) heating may be used to reduce the viscosity of the heavy oil to be extracted. During EM heating, an electrode/antenna array, which includes at least two electrodes and one antenna, may be placed in the reservoir near the wellsite. The electrode/antenna is configured to emit a current at a selected frequency for a predetermined amount of time. It may be advantageous to perform a reservoir simulation to determine a heating rate for the electrode/antenna array based on a frequency(s) of the EM source in the array and estimate an oil production rate for the EM heating system in the formation. As used herein, an EM array may refer to at least two electrodes and one antenna as a current source or a plurality of electrodes and antennas as current sources.

To model a heating rate for EM heating techniques, the effects of the EM array's characteristics, for example, the array topology, the EM frequency, geometric shape of the electrode/antenna, input power, and economy should be considered.

As used herein, the term array topology refers to the number of electrodes/antennas used in an array and the location of the electrodes/antennas in the wellbore with respect to each other, the reservoir formation, and the production-well, which essentially determines the geometrical arrangement of EM sources. In some embodiments, the electrodes/antennas may be disposed in substantially the same horizontal plane. In other embodiments, the electrodes/antennas may be disposed in a single layer of a multi-layer reservoir. In some other embodiments, the electrodes/antennas may be disposed in more than one layer of the multi-layer reservoir. The multi-layer reservoir will be discussed in more detail below.

EM heating may be categorized based on frequency, for example, low frequency (10 Hz-$10^3$ Hz Please enter range), medium frequency ($10^3$ Hz-$10^6$ Hz Please enter range), or high frequency ($10^6$ Hz-$10^9$ Hz). Different electromagnetic mechanisms underlie the electromagnetic heating using different kinds of EM sources. When a low frequency current source is applied, Joule heating, based on the electric conduction in materials, is dominant. With a high frequency electromagnetic source, dielectric heating prevails in which dipoles formed by the molecules tend to align themselves with the electric field (this is so called polarization) with a velocity proportional to the frequency of the field's alteration. This molecular movement can result in significant heating, as seen in microwave ovens. By applying a medium frequency EM source, both Joule heating and dielectric heating can occur.

When determining which EM frequencies should be used for heating, exponential decreasing of EM wave penetration into materials, or the skin effect, should be considered. The skin effect describes the relationship between the depth of penetration of EM power and the frequency of the EM source. EM frequency is inversely proportional to penetration depth. Therefore, high EM frequency source and large values for loss properties (i.e. dielectric loss factor and electric conductivity) of a material contribute to an increased dissipated power (heat), but shallow depth of penetration.

Based on the skin effect, a high frequency EM source may only heat up the formation in the close vicinity of the current source due to large values for the loss properties of a water-saturated formation and small depth of penetration. On the other hand, low frequency EM heating of a reservoir directly depends on the continuous conductive path for electric current between electrodes. That is for low frequency EM heating, reservoir water should be in liquid phase state, especially around the electrodes. In terms of reservoir formations, this means that if an area around the electrode is dry, low frequency heating may not be practical. However, high frequency EM waves may propagate through a water-free reservoir region and transfer energy to a remote area.

One of ordinary skill in the art will understand that in some situations it may be advantageous to use a medium frequency ($10^3$ Hz-$10^6$ Hz) electrode, which may allow both electric conduction and dielectric polarization to contribute to the heating process. In some embodiments, the frequency of the plurality of electrodes in the electrode array may be selected depending on characteristics of the reservoir formation.

In some embodiments, electrodes/antennas may be disposed in a single layer of a multi-layer reservoir. In other embodiments, the electrodes/antennas may be placed in more than one layer of the multi-layer reservoir. The number of layers containing electrodes/antennas, the array topology, and applied EM frequency are not intended to limit the scope of the disclosure.

Another electrode/antenna array characteristic to consider is the geometric shape of the electrodes/antennas. In some embodiments, the shape of the electrode may depend on the frequency of the EM source. By properly selecting the shape of electrode/antennas in an array we can have a degree of control over EM field distribution in the reservoir and therefore control over the area being heated.

Additionally, input power to the electrodes may be considered when determining an electrode array's characteristics. Further, overall economy of an electrode array should be considered, including, but not limited to the cost and time associated with installing and maintaining the electrodes in a reservoir.

In order to determine an analytical heating rate or temperature profile for a low frequency electrode, the electrode may be modeled as a point current source. Knowing that the electric field may be determined from the electric current density over conductivity, we may determine the potential given by the electrode at a distance R by integrating the electric field from infinity to R $$V_R = -\int_\infty^R E \cdot dx = -\int_\infty^R \frac{\rho I}{4\pi r^2} \hat{r} \cdot dx = \frac{\rho I}{4\pi R} \quad (1)$$

where $\rho$ is the earth resistivity and I is the current.

FIG. 1 shows a three-layer earth model for the heating rate analysis. One skilled in the art will appreciate that any number of layers may be used in a model without departing from the scope of this disclosure. $\rho_1$, $\rho_2$, and $\rho_3$, denote the resistivities of each layer and $h_1$, $h_2$, and $h_3$ denote the depth of each layer measured from a top surface of the first layer of the reservoir. For the following analysis, we may assume that $h_3=\infty$, that is that layer 3 extends to infinity. In this model, it is assumed that the properties for each layer were known and uniform through out the layer. Each layer is also assumed to have a uniform thickness with flat boundaries, that is the depth of the top surface and depth of the bottom surface of a layer remains the same. However, one of ordinary skill in the art would understand that the assumptions may be varied depending on the needs of the model.

In some embodiments, the reservoir characteristics used may be representative of an actual reservoir formation. For a low frequency EM source, the Laplace equation for electric voltage should be satisfied at any point.

$$\frac{\partial^2 V}{\partial r^2} + \frac{1}{r}\frac{\partial V}{\partial r} + \frac{\partial^2 V}{\partial z^2} = 0 \quad (2)$$

And the general solution may be written as $$V = \int_0^\infty (A(m)e^{-mz} + B(m)e^{mz}) J_0(mr) dm \quad (3)$$

where $J_0$ is the Bessel function of zero order. Using equation (1) for a voltage of a point source of current placed in a homogenous earth, we may calculate the potential due to an EM point source at any point in the three-layered model by taking the sum of the potential in the homogenous medium and other perturbation potentials due to the boundary conditions of equation (3). The constants A and B of equation (3) may be determined by the boundary conditions. Once the constants are determined, assuming no coupling between the source elements (electrodes), the potential at any point (x, y, z) in the i'th-layer from multiple source electrodes may be given by $$V_i(x,y,z) = \Sigma_k V_{ki} \Rightarrow E_i(x,y,z) = -\Sigma_k \nabla V_{ki} \quad (4)$$

and the dissipated power density at the same point may be given by $$p_i(x,y,z) = \frac{1}{\rho_i}|\Sigma_k \nabla V_{ki}|^2 \quad (5)$$

Using equations (4) and (5) an estimate of the heating rate for a computational cell (Vc) in the i'th-layer may be given by $$\frac{\Delta T}{\Delta t} \approx \frac{P_{EM}}{C_P} = \frac{\int_{V_C} p_i(x,y,z) dv}{C_P} \approx \frac{V_C}{C_P \rho_i}|\Sigma_k \nabla V_{ki}|^2 \quad (6)$$

where $C_P$ (J/° C.) is the heat capacity. The heating rate may then be used to calculate the temperature profile for the electrode array of interest. The temperature profile for the electrode array may be determined by selecting a heating period ($\Delta t$) and solving for the change in temperature ($\Delta T$).

In order to determine an analytical heating rate or temperature profile for a high frequency antenna array for a three layer earth model, as described above, the complex dielectric permittivity may be required in addition to the resistivity of the reservoir formation. Therefore, an analysis with the full Maxwell's equations may be performed. Here, we may consider the current source as a small vertical dipole antenna with the length of dl, located at ($x_k$, $y_k$, $z_k$), carrying a time-varying current with the amplitude of $I_k$, Maxwell equations in the i'th layer may be written as follows $$\nabla \times E_{ki} = -j\omega\mu H_{ki} \quad (7)$$

$$\nabla \times H_{ki} = J_k + \frac{1}{\rho_i}E_{ki} + j\omega\mu E_{ki}$$

-continued
$$J_k = (dl)I_k \delta(x - x_k)\delta(y - y_k)\delta(z - z_k)\hat{z}$$

$$\varepsilon_i = \varepsilon_i' - j\varepsilon_i''$$

where E is the electric field, H is the magnetic field, and J is the current density.

Next a two dimensional spatial Fourier transform may be applied to equations (7). Solving for the unknown coefficients by applying the boundary conditions of Maxwell's equations for each layer's boundaries, will yield the solution as:

$$\hat{H}_{kix} = \eta c^{-j(\xi x_k + \eta y_k)} h_{ki}(\gamma_0, \ldots, \gamma_3, z, z_k) \quad (8)$$

Next, to calculate the electric fields' components in phasor-domain, the inverse Fourier transformation of equation (10) may be taken.

$$E_{kir} = \frac{-j}{2\pi\alpha_i} \int_0^{+\infty} \frac{\partial h_i}{\partial z} \lambda^2 J_1(r\lambda) d\lambda \quad (9)$$

$$E_{kiz} = \frac{-\omega\mu}{2\pi k_i^2} \int_0^{+\infty} \left(\frac{\partial^2}{\partial z} + k_i^2\right) h_{ki} \lambda J_0(r\lambda) d\lambda$$

After a numerical evaluation of the integrals of equation (9), assuming no coupling between the current sources, the electric field in each layer may be given by $$E_k(x,y,z) = \Sigma_k E_{ki}(x,y,z) \quad (10)$$

Considering the dissipated power density at the same point, we may obtain a estimate of temperature increase in a computational cell (Vc) in the i'th layer as $$\frac{\Delta T}{\Delta t} \approx \frac{P_{EM}}{C_P} = \frac{\int_{V_C} p_i(x,y,z) dv}{C_P} \approx \frac{V_C}{2C_P}\left(\frac{1}{\rho_i} + \omega\varepsilon_i''\right)|\Sigma_k E_{ki}(x,y,z)|^2 \quad (11)$$

After determining the heating rate for a selected electrode/antenna array using equations (6) or (11), it may be input into a reservoir simulator. In some embodiments, determining the temperature profile may be integrated into an existing reservoir simulator. That is, the right-hand side of equations (6) or (11) may be integrated into the reservoir simulator. In other words, the heat rate calculated from EM sources are input into a reservoir simulator. The simulator then solves the transport equations to obtain temperature profile and oil production rate. The calculated temperature across the reservoir is then used to update the material properties of the formation. The updated information may be employed by an EM solver to calculate a new set of heat rate and this process continues recursively, which introduces a coupled EM-reservoir simulation. Reservoir characteristics corresponding to the three-layer earth model used to calculate the heating rate may be input into the reservoir simulator. Reservoir characteristics may already be known or estimated. Examples of reservoir characteristics may include reservoir parameters such as depth and size of the reservoir, initial reservoir conditions such as pressure and temperature, and fluid characteristics such as molecular weight and specific gravity. In some embodiments, these reservoir characteristics may be representative of an existing reservoir formation. After the EM heat rate is input into the reservoir simulator, the reservoir simulator may determine, using a processor, an oil production rate of the reservoir based on the inputs. The results may be output to the user as a graphical display.

Additionally, embodiments of the disclosure may provide methods of designing an electrode/antenna array. Designing an electrode/antenna array may include selecting a frequency for the plurality of electrodes/antennas and other electrode/antenna array characteristics, for example, electrode/antenna geometry and array topology. In other words, the proposed method can be potentially employed in an optimization process for an efficient selection of array frequency, arrangement and input power to maximize the oil production for a given reservoir.

Additionally, embodiments of the present disclosure may provide for evaluating an electrode array for oil recovery. This may include providing a temperature profile for a given electrode/antenna array. The heat rate profile may be calculated from equations (6) and/or (11). The heat rate profile may then be input into a reservoir simulator in order to calculate an oil recovery production rate for a given array setup. Based on the resulting oil recovery production rate, an electrode/antenna array may be selected and configured for installation and use in an existing reservoir.

In order to demonstrate the aforementioned analytical approaches for calculating the heating rate at different frequencies, two examples were completed. Each example compared the analytical temperature profile (found using equations 6 and 11) for two electrode/antenna arrays to temperature profile calculated by a numerical simulator embedded in the reservoir simulator. The first example focused on low frequency electrode arrays where the geometric configuration (or topology) of the electrodes was varied between two electrode arrays. The second example examined high frequency antenna arrays where the frequency of the electrodes was varied between the two antenna arrays.

Both examples used a commercial reservoir simulator, such as Schlumberger's ECLIPSE Thermal. The analytically determined EM heating rates were input into the reservoir simulator, where one year of EM heating was simulated for a 220 m long horizontal production well. The orientation of the well is not meant to limit the scope of the present disclosure. After the first year of EM heating, oil is produced continuously for another four years. In this model, it was assumed that the properties for each layer of a multi-layer earth model were known and uniform throughout the layer and during the production process. Each layer was also assumed to have a uniform thickness.

Reservoir characteristics were also input into the reservoir simulator to generate a reservoir model. The reservoir model shown in FIG. 1 (not to scale) represents a homogenous heavy oil reservoir at a depth of 430 m, comprised of three layers: overburden, pay zone, and underburden. The formation was modeled in a 22.24 acre pattern (i.e. 300 m×300 m) with a vertical dimension of 60 m that includes 25 m of overburden, 10 m of pay zone, and 25 m of underburden. During the simulation, the reservoir model is discretized into grid blocks in the i, j, and k directions. For the examples, each grid block represents a dimension of 20 m×20 m×1 m. However, one of ordinary skill in the art will understand the reservoir may be discretized such that each grid block may represent any desired volume.

The reservoir used in the examples also included a 220 m long horizontal well is disposed in the pay zone at a depth of approximately 30.5 m (i.e. midway between the top and bottom of the pay zone). The well has a diameter of 0.178 m (7 inches). The well is opened during the one year EM heating period with a bottom-hole pressure (BHP) of 39.8 bar. After the first year of EM heating, oil is produced continuously at a constant BHP of 10 bar for a total period of four years.

The modeled reservoir had an initial reservoir pressure of 40 bar and initial temperature of 24° C. The porosity and permeability of the pay zone are 0.35 and 5,000 md, respectively. The irreducible water saturation of the pay zone is 20%, which corresponds to an initial oil saturation of 80%. The formation volumetric heat capacity and thermal conductivity are 2,390 kJ/m$^3$-° C. and 146.9 kJ/m-day-° C., respectively.

Fluid characteristics were also input into the reservoir simulator. For the examples, the heavy oil had a molecular weight of 458 kg/kg-mole and a specific gravity of 11.3° API (or density of 981 kg/m$^3$). The heavy oil may be comprised of both dead oil and live oil. The dead oil and live oil viscosities are 21,040 cp and 9,022 cp, respectively at the initial reservoir conditions of 40 bar and 24° C. The phase equilibrium constant (K-value) of the dissolved gas at the initial reservoir conditions is 7.3, which corresponds to a dissolved gas mole fraction of 0.137 in the oil phase and an initial gas-oil ratio of 8.4 m$^3$/m$^3$. Resistivity of the pay-zone is 18 ohm-m and in overburden and underburden regions it is 5 ohm-m. The relative complex permittivity of the payzone is 10−j0.5 and that of overburden and underburden is 3−j0.001. The oil compressibility and thermal expansion coefficient are 3.5×10$^{-5}$/bar and 5.58×10$^{-4}$/K, respectively.

The same reservoir parameters, initial reservoir conditions, and fluid characteristics were used for both examples. However, one of ordinary skill in the art would understand that in other trials the same electrode array characteristics (i.e. topology, frequency, and electrode geometry) are used while the reservoir characteristics, initial reservoir conditions, and fluid characteristics may be altered.

EXAMPLE 1

Low Frequency Electromagnetic Heating

An example of modeling electromagnetic heating for heavy oil recovery in accordance with embodiments disclosed herein is now described. As discussed above, the geometrical configuration of individual electrode sources may affect the performance of the electromagnetic heating. For the low frequency electromagnetic heating, the effect of the geometrical configuration of the electrode arrays was analyzed.

Figure 2A:
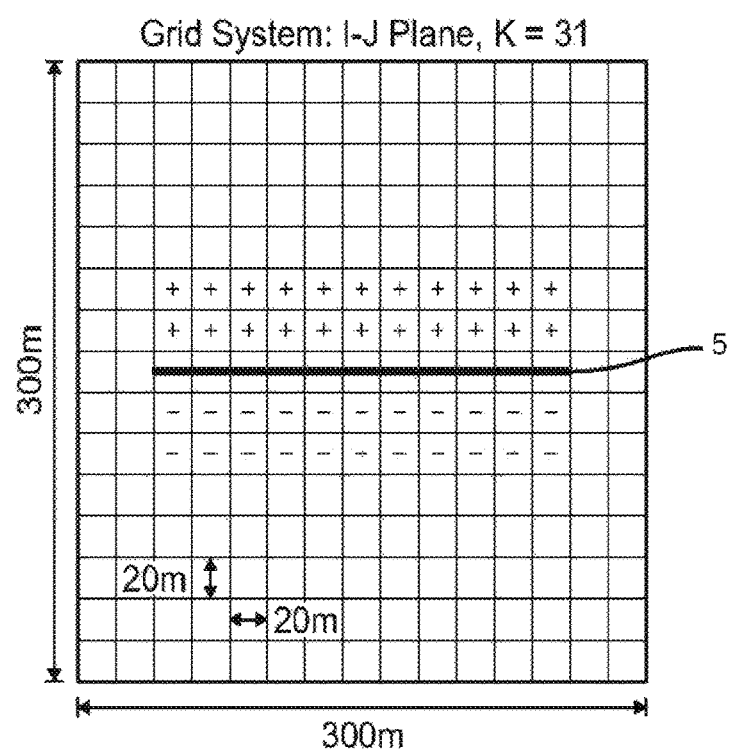
FIGS. 2A-2C illustrates a sample electrode array and resulting temperature profiles according to embodiments disclosed herein.

Two different configurations of electrode array were considered for EM heating, as shown in FIGS. 2A (case 1) and 3A (case 2). Each configuration has 66 electrodes that may be modeled as a point source emanating at center of the electrode cell. Each electrode carries 100 amps.

Referring to FIG. 2A, three rows of eleven electrodes with positive polarity are disposed along one side of the production well 5 and three rows of eleven electrodes with negative polarity are disposed along the other side of the production well. The electrodes are located on the same horizontal plane as the production well 5.

Figure 3A:
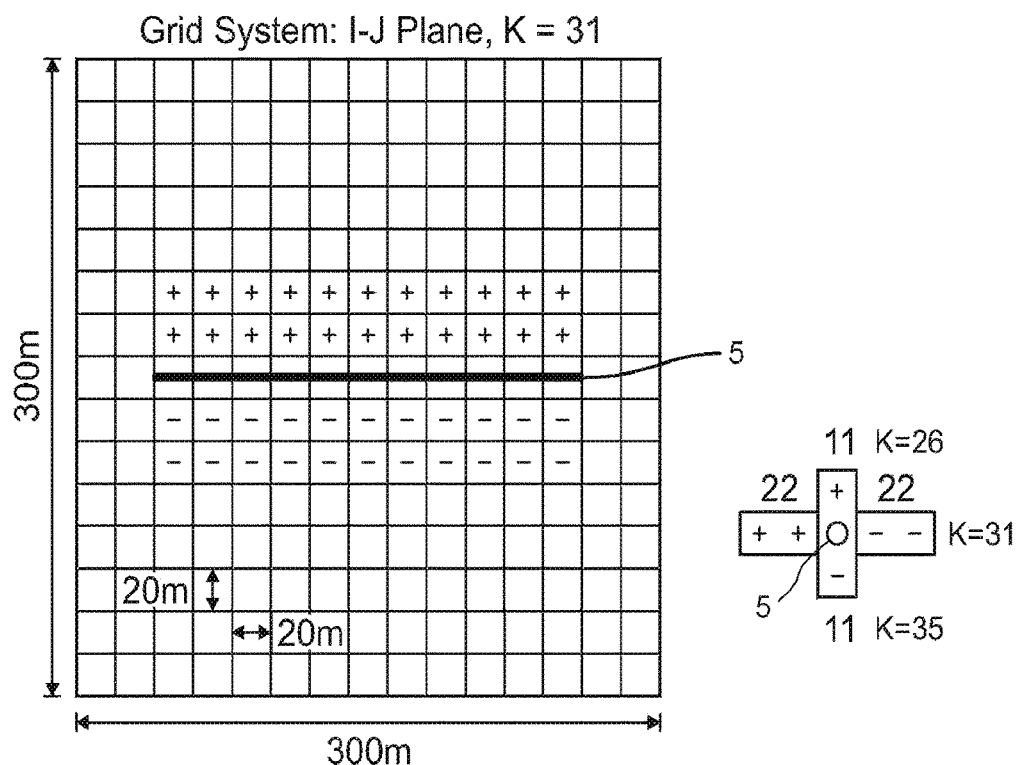
FIGS. 3A-3C illustrates a sample electrode array and resulting temperature profiles according to embodiments disclosed herein.

Referring to FIG. 3A, two rows of eleven electrodes with positive polarity are disposed along one side of the production well 5 and two rows of eleven electrodes with negative polarity are disposed along the other side of the production well. In addition a single row of eleven electrodes with positive polarity is disposed above the horizontal well 5, running along the length of the well. Similarly, a single row of eleven electrodes with negative polarity is disposed along the bottom of the horizontal well 5.

Figure 2B:
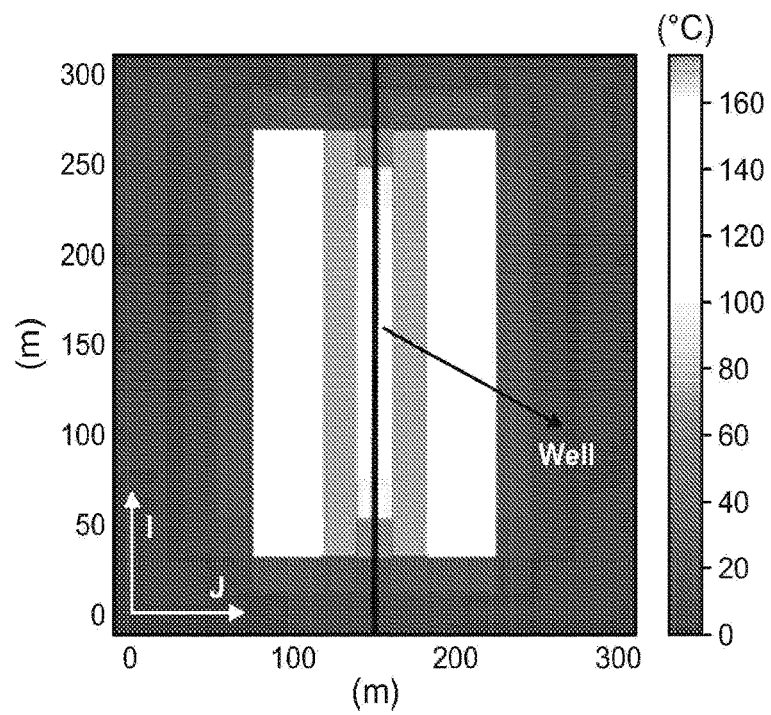
Figure 2C:
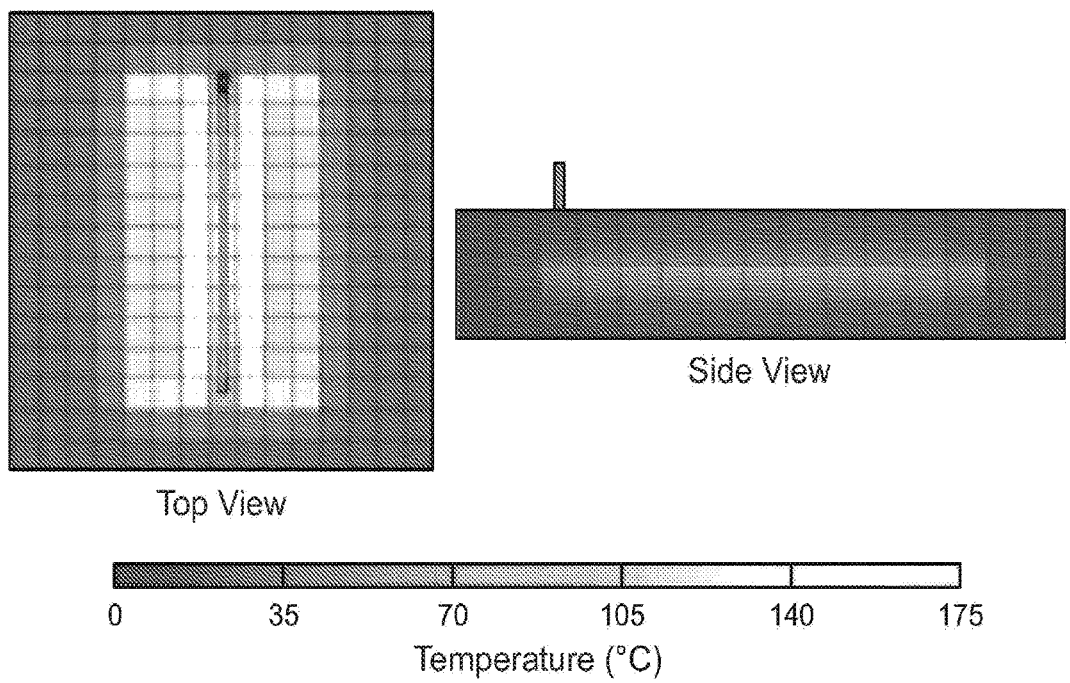
Figure 3B:
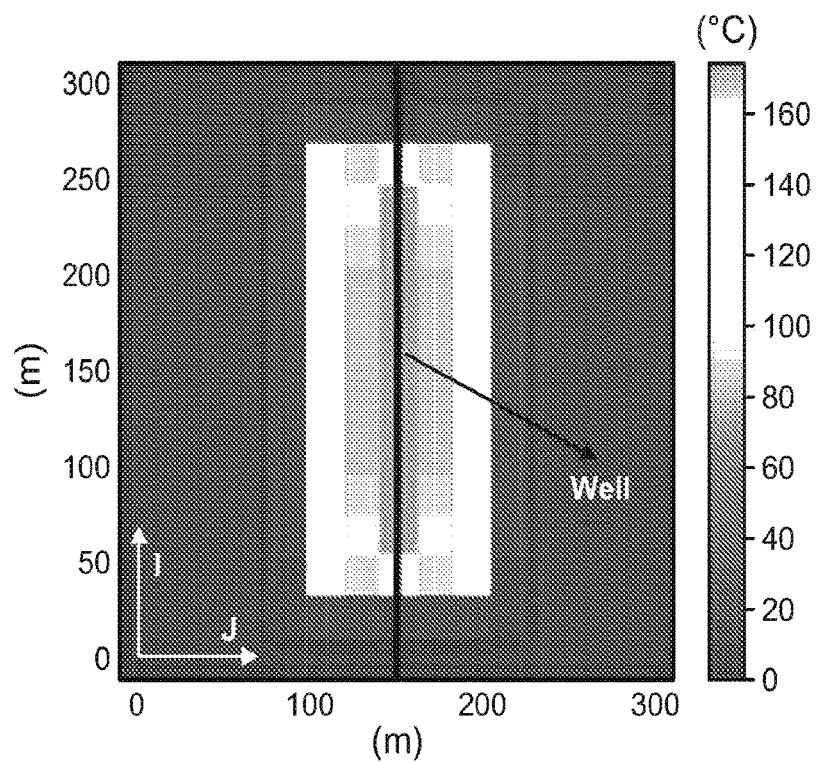
Figure 3C:
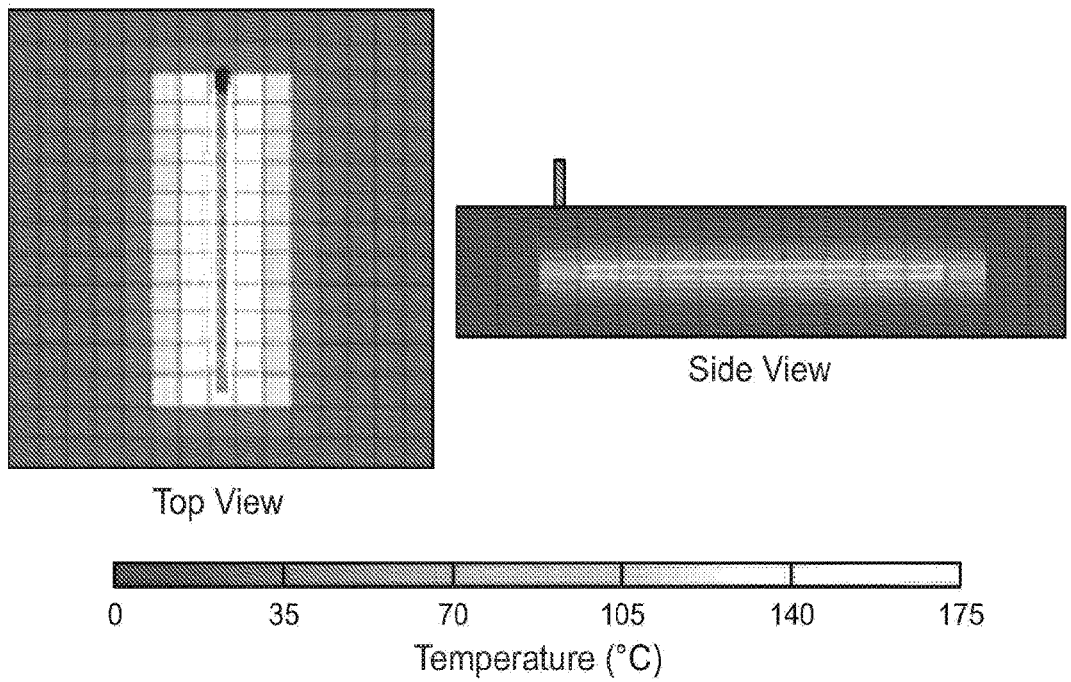

Equation (6) was used to calculate the temperature estimation at the middle of the payzone after one year of heating for cases 1 and 2. FIG. 2B shows a top view of the analytical estimation of temperature distribution in a cross section containing the horizontal well after one year of low frequency heating for case 1. FIG. 3B is a top view of the analytical estimation of temperature distribution for case 2. For case 1, the electrode configuration resulted in a wide heating area around the horizontal well. On the other hand, the electrode configuration for case 2 resulted in a higher temperature at the location of the horizontal well. To ensure accuracy the analytical solutions determined in FIGS. 2B and 3B were compared to two numerical simulations run with the same parameters and electrode configurations used for cases 1 (FIG. 2C) and case 2 (FIG. 3C) described above. As seen in a comparison of FIGS. 2B and 3C, and FIGS. 2B and 3C, the analytical results were consistent with the more accurate, but time intensive numerical results.

Figure 4:
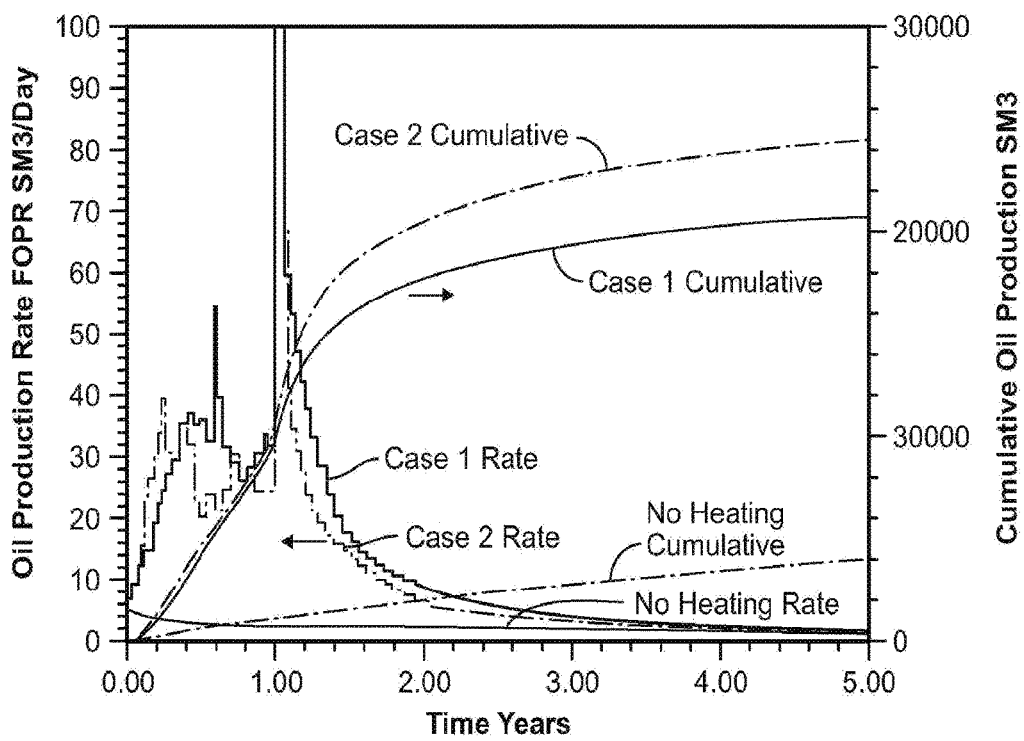
FIG. 4 illustrates oil production for various electrode arrangements.

The heat rates determined from equation (6) were then input into a reservoir simulator to calculate oil production performance. FIG. 4 shows the comparison of the oil recovery performance between case 1, case 2, and a base case of no EM heating. It is noted that both cases with EM heating result in greater oil recovery performance compared to the base case. Oil production during the first year for both cases with EM heating is mainly due to thermal expansion of the oil. For both EM heating cases, peak of the oil production rates occurs at the start of oil production after one-year of EM heating, then decline. The oil recovery performance after five years for case 1 produced more oil than that of case 2. This confirms with a fixed input power and frequency, how electrodes arrangement in the reservoir affect the heating profile and consequently the oil production. Therefore, such arrangement is subject to an optimization process to maximize the oil recovery.

EXAMPLE 2

High Frequency Electromagnetic Heating

Another example of modeling electromagnetic heating for heavy oil recovery in accordance with embodiments disclosed herein is now described. As discussed above, the electromagnetic frequency and the input power may affect the performance of the electromagnetic heating. For high frequency electromagnetic heating, the effect of the electromagnetic source frequency was analyzed.

Two different frequencies were selected to model the EM sources. In case 3, the source frequency is 10 kHz; in case 4, the source frequency is 300 kHz. The antenna configuration for cases 3 and 4 is identical to the configuration described with respect to case 2 in Example 1 carrying currents from 10 A to 30 A.

Figure 5:
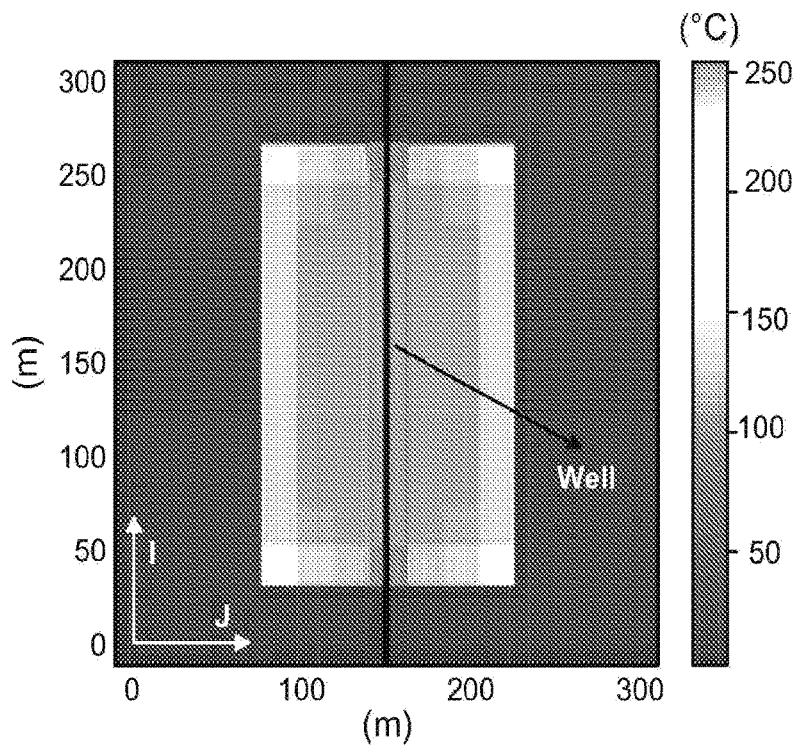
FIG. 5 illustrates a temperature distribution for a selected electrode array.
Figure 6:
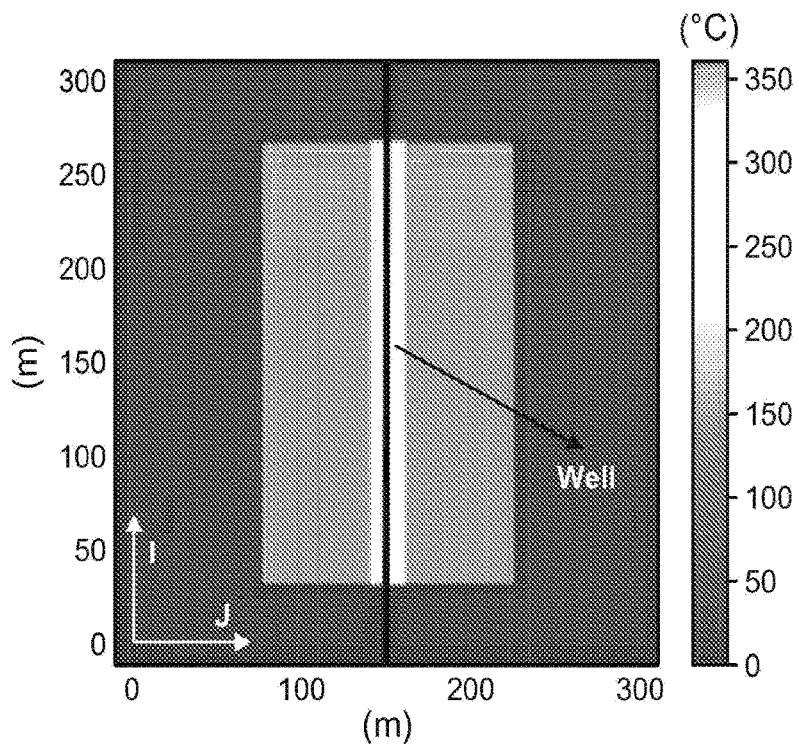
FIG. 6 illustrates a temperature distribution for a selected electrode array.

Equation (11) was used to calculate the analytical estimation of the temperature distribution after one year for cases 3 and 4. FIG. 5 shows a top view of the temperature distribution in cross-section containing the horizontal well after one year of 10 kHz frequency EM heating for case 3. FIG. 6 shows a top view of the temperature distribution in cross-section containing the horizontal well after one year of 300 kHz frequency EM heating for case 4. Based on a comparison of FIGS. 5 and 6, case 3 resulted in heating an area to a lower temperature than case 4. To ensure accuracy the analytical solutions determined in FIGS. 5 and 6 were compared to two numerical simulations run with the same parameters and EM source configurations used for cases 3 and 4 described above. Again, the analytical results were consistent with the numerical results.

Figure 7:
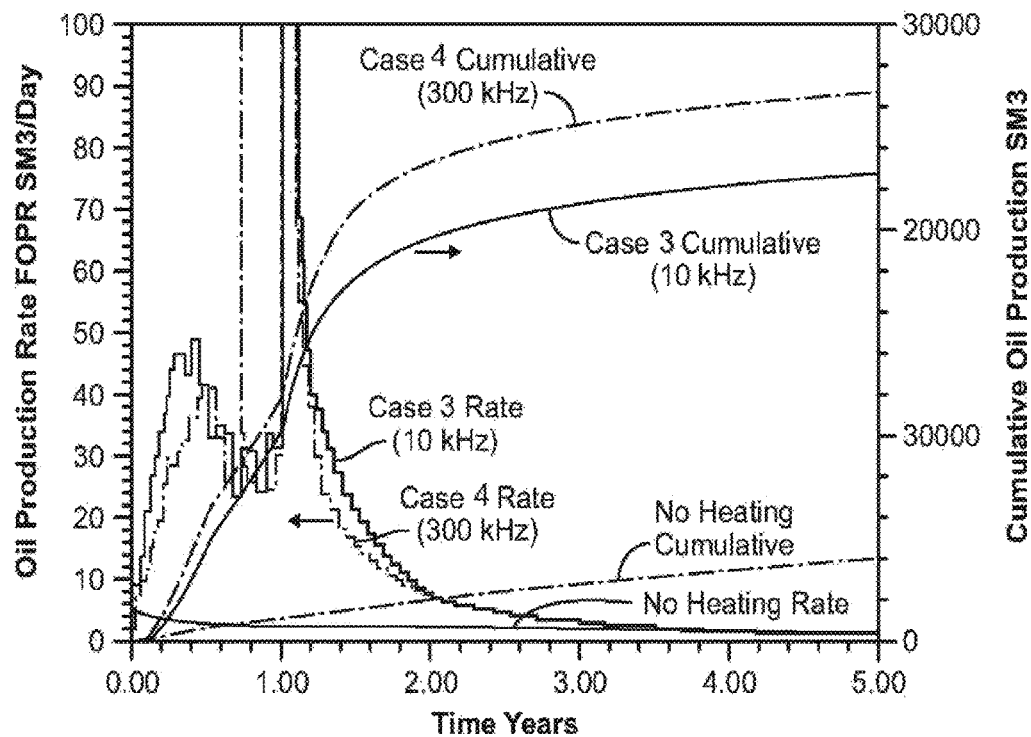
FIG. 7 illustrates oil production for different electrode frequencies.

The heat rates determined from equation (11) were then input into a reservoir simulator to calculate oil production performance. FIG. 7 shows the comparison of the oil recovery performance between case 3, case 4, and a base case of no EM heating. It is noted that both cases with EM heating result in greater oil recovery performance compared to the base case. Oil production during the first year for both cases with EM heating is mainly due to thermal expansion of the oil. For both EM heating cases, peak of the oil production rates occurs at the start of oil production after one-year of EM heating, then decline. The oil recovery performance after five years for case 4 produced more oil than that of case 3.

Figure 8:
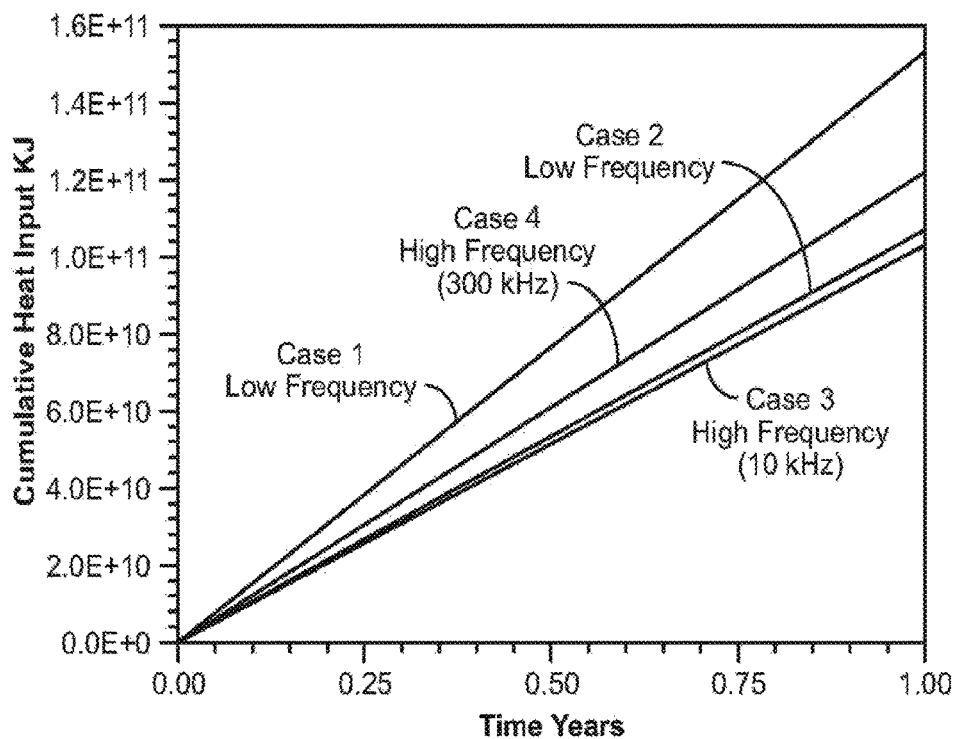
FIG. 8 illustrates oil production for different electrode arrays.

FIG. 8 shows how the total heat input after one-year EM healing for both the low and high frequency cases. For the low frequency scenario (Example 1), case 1 has a higher total heal input compared to case 2, where case 1 resulted in a wider heating area. In the high frequency setup (Example 2), case 4 has a higher total heat input compared to case 4 that results in a hotter heating area. For this particular formation, case 1 resulted in the largest heat input.

Although the methods described herein do not account for the changes in material properties during the heating process, one of ordinary skill in the art would understand that equations (6) and (11) could be modified to account for changes in material properties, for example, electromagnetic thermal properties of the oil due to heating.

Figure 9:
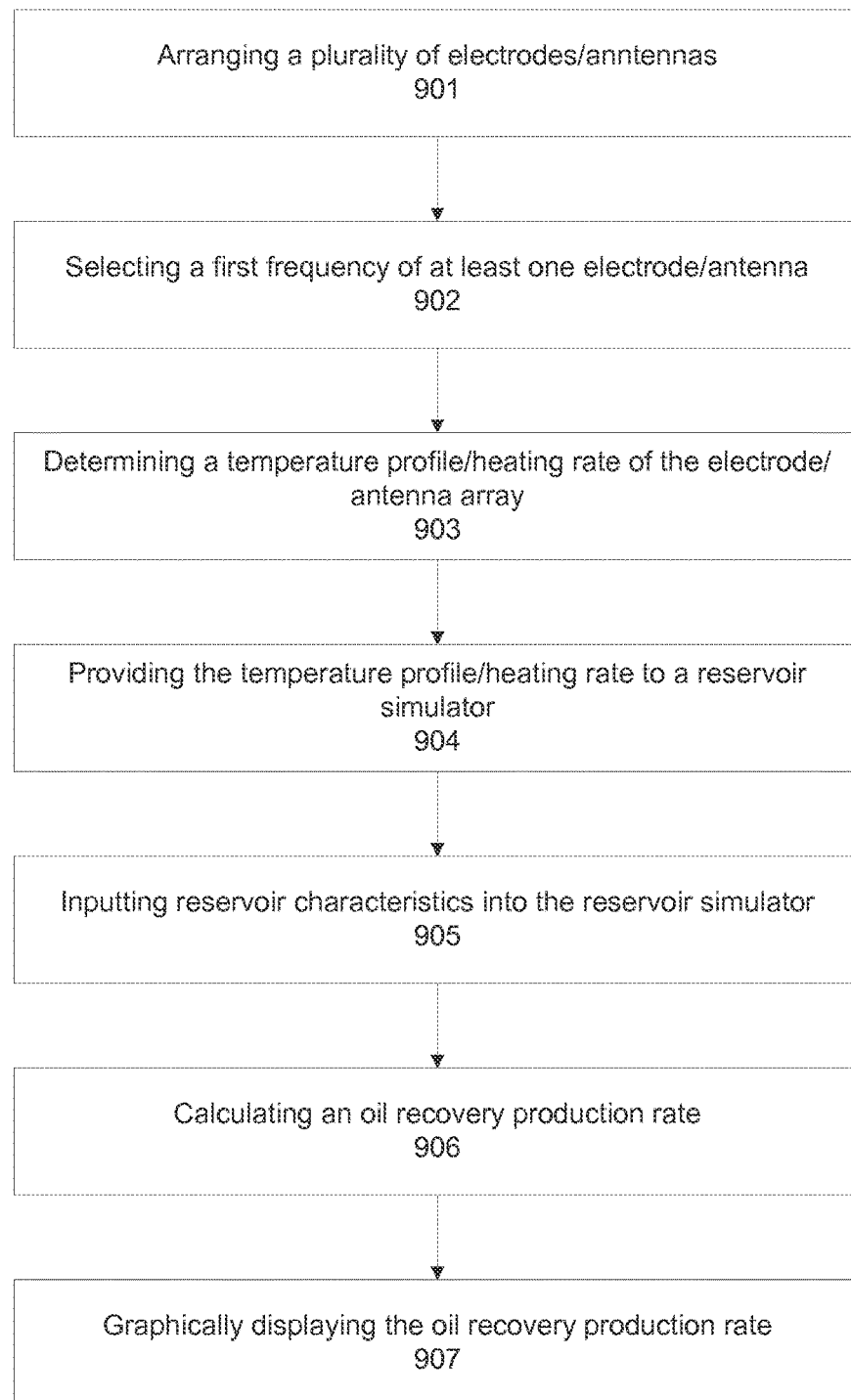
FIGS. 9 and 10 illustrate flow charts for methods in accordance with one or more embodiments of the present disclosure.

In one embodiment, referring to FIG. 9, a method for modeling electromagnetic heating starts with arranging a plurality of electrodes/antennas in an array in a multi-layer earth model of a reservoir formation (901).

The arranging may include selecting a number of electrodes/antennas, an electrode electrodes/antennas geometry, and an electrode electrodes/antennas array topology. Next a first frequency of electrodes/antennas in the electrode array may be selected (902). Next a heat rate generated by the array of EM sources using the first frequency and reservoir formation characteristics may be determined (903). The rough estimation of temperature profile may be found using equations (6) and (11), as discussed above. The determined heat rate may then be provided to a reservoir simulator (904); additionally, reservoir characteristics may be input into the reservoir simulator (905). Once the reservoir simulator has received all of the inputs, an accurate temperature profile as well as oil recovery production rate of the reservoir may be calculated based on the heat rate generated by EM energy dissipation and reservoir characteristics (906). Finally, the reservoir simulator may produce a graphical display of the oil recovery production rate (907).

Figure 10:
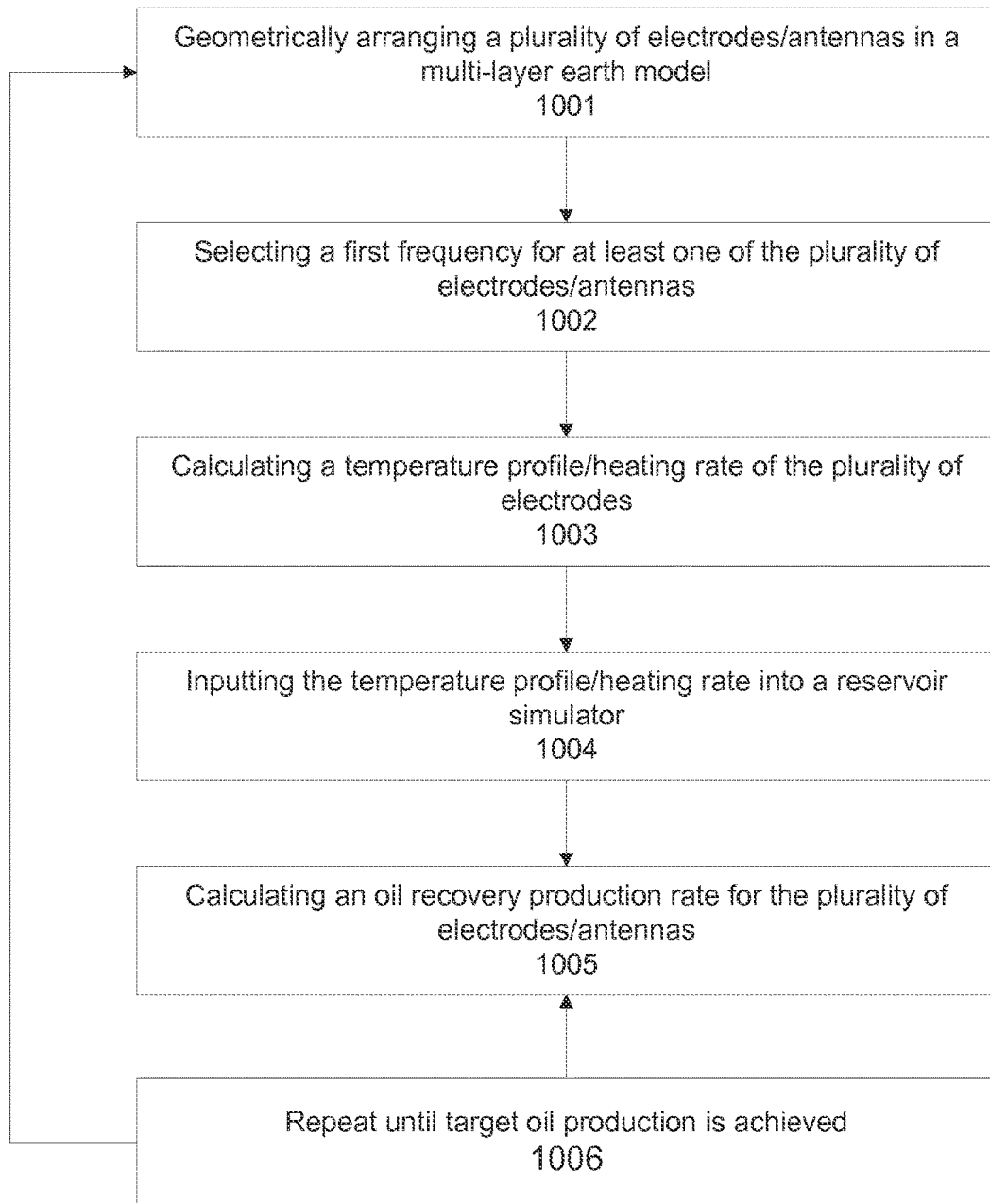

In another embodiment, referring to FIG. 10 a method of designing an optimal electrode/antenna array for oil recovery may begin with geometrically arranging a first plurality of electrodes/antennas in a multi-layer earth model (1001). Next, a frequency of the first plurality of electrodes may be selected (1002). After configuring the electrode/antenna array in the multi-layer earth model, a heating rate of the first plurality of electrodes/antennas may be calculated. In one embodiment the heat rate is calculated using the frequency and the right hand side of equations (6) and/or (11), (1003). The determined heating rate may be input into a reservoir simulator (1004), where the reservoir simulator may calculate, by processor, an oil recovery production rate for the electrode array (1005). The above process, including, selecting, arranging, calculating a heating rate and calculating an oil recovery production rate may be repeated until a target oil recovery production rate is achieved (1006). For each iteration (i.e. repeating the selecting, arranging, calculating a heating rate and calculating an oil recovery production rate), at least one of the geometrically arranging and selecting a first frequency may be different from a frequency and geometrical arrangement of the first (or previous) plurality of electrodes/antennas.

Although the methods described herein are directed to heavy oil recovery production, one of ordinary skill in the art would understand that the methods may be used in other applications, for example, wide frequency range modeling of electromagnetic pre-heating. Pre-heating may be completed in a reservoir to create preferential pathways for steam injection, which can enhance steam injectivity and may minimize heat losses during steam injection.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. Moreover, embodiments disclosed herein may be practiced in the absence of any element which is not specifically disclosed.

What is claimed:

1. A method of modeling electromagnetic heating for oil recovery for a wide range of frequencies, the method comprising:
    arranging a plurality of electrodes or antennas in an array in a multi-layer earth model of a reservoir formation, wherein the arranging includes selecting a number of electrodes or antennas and an array topology;
    selecting a frequency of the array;
    determining a temperature profile of the reservoir using the frequency and reservoir formation characteristics;
    providing a heat rate to a reservoir simulator wherein providing the heat rate comprises calculating a power input for the plurality of electrodes or antennas;
    inputting reservoir characteristics into the reservoir simulator;
    calculating, by a processor, an oil recovery production rate of the reservoir based upon, at least in part, the heat rate and reservoir characteristics;
    graphically displaying the oil recovery production rate; and
    based upon the power input that was calculated, selecting and configuring an electrode or antenna array and installing the electrode or antenna array at an existing reservoir.

2. The method of claim 1, wherein a frequency is selected to be a low frequency, a medium frequency, or a high frequency.

3. The method of claim 1, wherein providing the heat rate comprises calculating a power dissipation for the electrode/antenna arrangement.

4. The method of claim 1, wherein the reservoir characteristics comprise at least one of selected from reservoir parameters, reservoir conditions, and well characteristics.

5. The method of claim 4, wherein the reservoir parameters comprise at least one selected from depth, area, overburden thickness, pay zone thickness, underburden thickness.

6. The method of claim 4, wherein the reservoir conditions comprise at least one selected from initial pressure, initial temperature, porosity, and permeability, water saturation, and oil saturation.

7. The method of claim 4, wherein the well characteristics comprise at least one selected from depth, well length, and well diameter.

8. The method of claim 4, wherein the reservoir characteristics are representative of an existing formation.

9. The method of claim 1, where in the array comprises one of a (a) a plurality of electrodes; (2) a plurality of antennas; or (3) a plurality of electrodes and at least one antenna.

10. A method of designing an electrode array for oil recovery, the method comprising:
    geometrically arranging a first plurality of electrodes or antennas in an array in a multi-layer earth model;
    selecting a first frequency for at least one of the first plurality of electrodes or antennas;
    calculating a heating rate of the first plurality of electrodes or antennas using the first frequency;
    inputting the heating rate into a reservoir simulator;
    calculating, by processor, an oil recovery production rate for the array;
    repeating the selecting, arranging, calculating a heating rate and calculating an oil recovery production rate until a target oil recovery production rate is achieved, wherein at least one of the geometrically arranging and selecting a first frequency is different from a frequency and geometrical arrangement of the first plurality of electrodes or antennas; and
    installing the different geometrical arrangement at an existing reservoir based upon, at least in part, the repeating.

11. The method of claim 10, wherein the multi-layer earth reservoir formation comprises at least two layers.

12. The method of claim 10, wherein the plurality of electrodes or antennas are arranged in at least two layers of the multi-layer earth model.

13. The method of claim 10, further comprising producing a graphical display of at least one of the analytical heating rate and oil production rate for each electrode.

14. A method of evaluating an electrode array for oil recovery, the method comprising:
    selecting characteristics of an electrode or antenna array, wherein the characteristics comprise at least one selected from frequency and geometry;
    geometrically arranging one or more electrodes or antennas associated with the electrode or antenna array in a first reservoir formation;
    calculating a heating rate of the electrode or antenna array using EM dissipated energy equation, wherein calculating a heating rate includes iteratively determining an optimum frequency associated with the electrode or antenna array;
    inputting the heating rate into a reservoir simulator;
    calculating, by a processor, an oil recovery production rate for the electrode or antenna array;
    repeating the geometrically arranging, calculating a heating rate and calculating an oil recovery production rate for at least a second reservoir formation; and
    based upon the optimum frequency that was calculated, selecting and configuring an electrode or antenna array and installing the electrode or antenna array at an existing reservoir.

15. The method of claim 14, wherein the electrodes or antennas of the array are disposed in a single horizontal plane.

16. The method of claim 14, wherein the reservoir formation is a three-layer earth model.

17. The method of claim 14, further comprising inputting reservoir parameters, reservoir conditions, well characteristics, and fluid characteristics into the simulator.

18. The method of claim 14, further comprising producing a graphical display of the oil production rate for each calculated oil recovery production rate.

* * * * *